US012055586B1

(12) United States Patent
Kumar et al.

(10) Patent No.: US 12,055,586 B1
(45) Date of Patent: Aug. 6, 2024

(54) 3D STACKED DIE TESTING STRUCTURE

(71) Applicant: Cadence Design Systems, Inc., San Jose, CA (US)

(72) Inventors: Sagar Kumar, Rudrapur (IN); Rajesh Khurana, Noida (IN); Vivek Chickermane, Slaterville Springs, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 47 days.

(21) Appl. No.: 18/113,898

(22) Filed: Feb. 24, 2023

(51) Int. Cl.
*G01R 31/317* (2006.01)
*G01R 31/3185* (2006.01)

(52) U.S. Cl.
CPC ........ *G01R 31/31723* (2013.01); *G01R 31/318555* (2013.01); *G01R 31/318597* (2013.01)

(58) Field of Classification Search
CPC ...... G01R 31/31723; G01R 31/318555; G01R 31/318597
See application file for complete search history.

(56) References Cited

U.S. PATENT DOCUMENTS

| 10,797,037 | B1* | 10/2020 | Lin ................ G11C 7/1078 |
| 10,998,904 | B1* | 5/2021 | Agarwal ........... H01L 25/0657 |
| 11,990,446 | B2* | 5/2024 | Fay ................ H01L 24/85 |
| 2013/0024737 | A1* | 1/2013 | Marinissen .... G01R 31/318511 714/E11.155 |

OTHER PUBLICATIONS

B. Noia, K. Chakrabarty, S. K. Goel, E. J. Marinissen and J. Verbree, "Test-Architecture Optimization and Test Scheduling for TSV-Based 3-D Stacked ICs," in IEEE Transactions on Computer-Aided Design of Integrated Circuits and Systems, vol. 30, No. 11, pp. 1705-1718, Nov. 2011 (Year: 2011).*
"IEEE Standard for Test Access Architecture for Three-Dimensional Stacked Integrated Circuits," in IEEE Std 1838-2019, vol., No., pp. 1-73, Mar. 13, 2020 (Year: 2020).*

* cited by examiner

*Primary Examiner* — Cynthia Britt
(74) *Attorney, Agent, or Firm* — Schwegman Lundberg & Woessner, P.A.

(57) ABSTRACT

Methods and systems are provided for testing three-dimensional (3D) stacked dies of integrated circuits (ICs). The methods and systems receive, by test signal routing logic implemented on a first die, a first die test signal, the test signal routing logic operating in an elevate mode or turn mode. The methods and systems receive a second die test signal from a second die and route the first die test signal to an external device in the turn mode. The methods and systems route the second die test signal received from the second die to the external device in the elevate mode.

20 Claims, 6 Drawing Sheets

3D STACKED DIE TESTING STRUCTURE

TECHNICAL FIELD

The present disclosure generally relates to the technical field of circuit design and integrated circuits (ICs). In particular, the present disclosure addresses systems and methods for testing three-dimensional (3D) stacked IC dies.

BACKGROUND

An IC layout specifies portions of various components of an IC. An IC typically includes a large number of registers, latches, flip-flop multipliers, and/or other types of clocked devices, which are referred to herein generally as "clock sinks" or "sinks." As Moore's Law application begins to slow down, heterogenous integration is emerging as a trend where known good dies (KGD) are stacked on each other as 3D dies (or 3D chips). These dies are interconnected via solder bumps or other physical interface elements, such as through-silicon vias (TSV).

BRIEF DESCRIPTION OF THE DRAWINGS

To easily identify the discussion of any particular element or act, the most significant digit or digits in a reference number refer to the figure number in which that element is first introduced.

Various ones of the appended drawings merely illustrate example embodiments of the present inventive subject matter and cannot be considered as limiting its scope.

DETAILED DESCRIPTION

Figure 1:
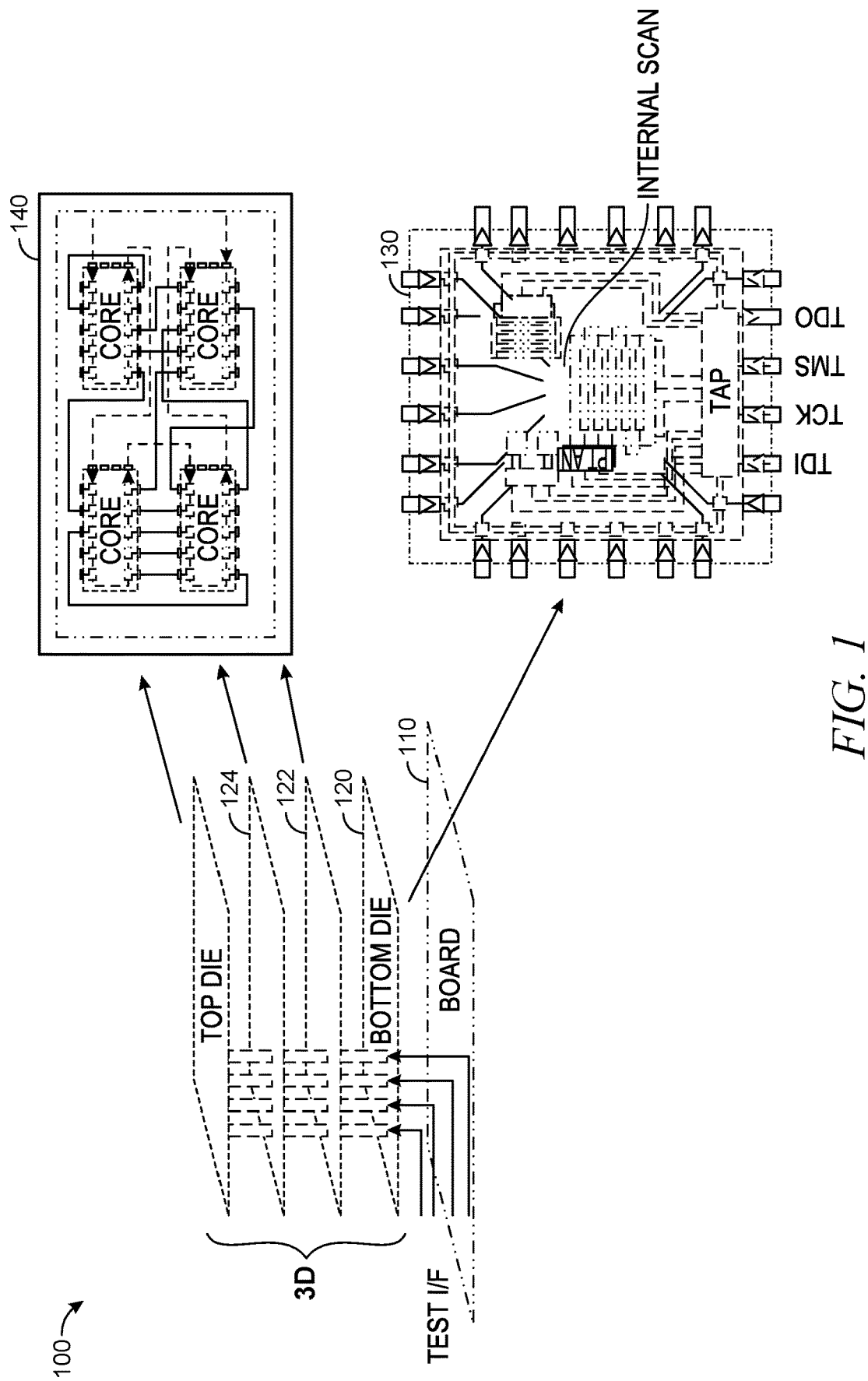
FIG. 1 illustrates an example circuit design having a 3D stack of IC dies, in accordance with some embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Conventional systems can stack multiple dies on top of one another. Particularly, each die can implement various types of logic using one or more cores. The dies can be the same or can be different. The dies can be individually tested in pre-bonding stages to verify proper operation and to label the dies as KGD. Then, the dies are vertically assembled one on top of the other to create a vertical die stack, which is a 3D structure. The stacking process can introduce new defect types related to die-die interconnects (pads, bonds, solder balls) and various other issues. As such, after the dies are stacked to create the 3D structure, post-bonding testing stages are conducted to ensure that the entire structure operates properly. Usually, the stacking process allows an external component, such as a controller or device implemented on a printed circuit board (PCB), to only directly access the bottom-most die (e.g., the bottom die in the stack). The external component does not have direct physical access to dies in the 3D structure between the top-most die and the bottom-most die or the top-most die itself. These are referred to as non-bottom dies.

Since there is no direct access to non-bottom dies in the 3D stack, one of the main challenges in 3D IC testing is testing such dies and providing a way to test controllability and observability from the PCB to any dies in the 3D stack. Particularly, conventional systems provide no mechanism for a controller on the PCB to provide test data to any individual die in the 3D stack and to receive output of such test data. Some conventional approaches that allow the controller to access each individual die for testing involve the creation of specific dedicated and complex hardware on each individual die. The complex hardware can be used to either bypass signals received from previous die in the stack and provide such signals to the next die in the stack (e.g., vertically up the stack) or to process the signals by a given die and return the processed signals back to the external device. However, such hardware involves complex control signals that can add additional complexity and control signals at the bottom die connections, thereby increasing the number of test signals required. Also, such complex hardware may need to be implemented on each of the dies for performing pre-bond tests and separately implemented for testing the dies after being stacked together to perform post-bond tests. Such hardware is non-standard and requires proprietary tools to understand and process the test-data, which limits portability across tools and involves more effort to develop and stabilize a 3D IC chip. Also, the hardware for a bottom die may need to be different from the hardware at the top die, which severely limits the fabrication process as the bottom die needs to be fabricated separately from rest of the dies. In addition, the total number of defects and the test-time and pattern count increases with the extra amount of hardware that is needed for performing such test operations efficiently and effectively.

Embodiments of the present disclosure are directed to a circuit design and system that implement techniques for testing a 3D die structure using a secondary die test interface (SDTI) module, also referred to as a test signal routing logic. Particularly, the disclosed examples simplify the process of assembling a 3D die structure by utilizing minimal hardware circuitry with simple logic operations that are identical across each of the dies in the 3D die structure to selectively and intelligently route test signals between the various dies in the 3D die structure. For example, a die in the middle of the 3D die structure can be programmed or configured to be tested by storing a value indicating that the die is the subject of being tested in the test signal routing logic. Test signals can be received by and/or generated by the test signal routing logic of the middle die. These test signals can be routed back to a previous (e.g., lower) die that is bonded to the middle die in the 3D die stack using the test signal routing logic, such as when the middle die is operating in a turn mode. On the other hand, when the test signal routing logic stores a value indicating that the middle die is not the subject of test operations, the test signal routing logic of the middle die operates in an elevate mode. In such cases, the test signal routing logic of the middle die routes test signals received from the previous or lower die to a next or upper die that is bonded to the middle die in the 3D die stack or structure.

As such, additional complexities are not introduced by utilizing the SDTI module because the test signal routing logic is simple to implement. Also, each die in the stack can use and implement the same exact SDTI module, which further reduces the design and implementation complexities encountered by conventional approaches. In this way, each individual die in a 3D die stack can selectively be tested by an external component implemented on a PCB or a bottom die which improves the overall functioning of the device and reduces complexities and time. This also reduces the overall cost in designing and testing a 3D stack of dies.

In some examples, a system is provided including a first die with one or more cores and test signal routing logic implemented on the first die. The test signal routing logic operates in an elevate mode or turn mode and is configured to receive a first die test signal. The test signal routing logic receives a second die test signal from a second die and routes the first die test signal to an external device in the turn mode. The test signal routing logic routes the second die test signal received from the second die to the external device in the elevate mode. In the elevate mode, the first die (e.g., a bottom die) allows signals received from an adjacent die (e.g., the second die) to be provided to the external component via the first die.

In some examples, the external device includes a controller configured to test a plurality of dies. In some examples, the external device includes a third die. In some examples, the first die is bonded between the third die and the second die to form a 3D stacked IC die structure.

In some examples, the first die test signal is generated by the one or more cores of the first die as a result of processing a test pattern applied to the one or more cores. In some examples, the first die test signal is received from a third die that is bonded to the first die.

In some examples, the test signal routing logic includes a multiplexor that receives the first die test signal and the second die test signal. The test signal routing logic includes a shift register coupled to an output of the multiplexor. The shift register can be coupled to a select input of the multiplexor to control whether the test signal routing logic operates in the elevate mode or the turn mode.

In some examples, the shift register stores a value representing whether the test signal routing logic operates in the elevate mode or the turn mode. In some examples, the first and second die test signals include serial data signals. In some examples, the system includes post bond activation circuitry configured to selectively activate the test signal routing logic. In some examples, the post bond activation circuitry includes a selection circuitry that is configured to receive a first set of data corresponding to pre-bond operations of the first die. The post bond activation circuitry receives a second set of data corresponding to post-bond operations of the first die and receives a post bond select signal. An output the first or second set of data is provided to an activation input of the test signal routing logic based on the post bond select signal.

In some examples, the test signal routing logic is in a deactivated state when the first set of data is received by the test signal routing logic. The test signal routing logic is in an active state when the second set of data is received by the test signal routing logic.

In some examples, the system includes a Joint Test Action Group (JTAG) controller implemented on the first die for generating one or more control signals. The JTAG implements standards for on-chip instrumentation in electronic design automation (EDA) as a complementary tool to digital simulation. The JTAG controller specifies the use of a dedicated debug port implementing a serial communications interface for low-overhead access without requiring direct external access to the system address and data buses. The JTAG interface connects to an on-chip Test Access Port (TAP) that implements a stateful protocol to access a set of test registers that present chip logic levels and device capabilities of various parts. The one or more control signals of the JTAG controller are routed to be processed by the one or more cores when the post bond select signal is deactivated and the one or more control signals generated by the JTAG controller are bypassed to route control signals from a third die to the one or more cores when the post bond select signal is activated. The third die can be bonded to the first die.

In some examples, the system includes a third die. The first die can be bonded above the third die and below the second die. The third die provides the first die test signal to the test signal routing logic of the first die. The first die test signal is passed through the first die to the second die and to the test signal routing logic of the first die. The second die includes an additional instance of the test signal routing logic. In some examples, the additional instance of the test signal routing logic is configured to operate the second die in the turn mode or elevate mode. In some examples, when the additional instance of the test signal routing logic operates the second die in the turn mode, the additional instance of the test signal routing logic is configured to receive test output data by one or more cores of the second die and provide the test output data to the first die as the second die test signal. The first die provides the test output data to the third die including the external device.

In some examples, when the additional instance of the test signal routing logic operates the second die in the elevate mode, the additional instance of the test signal routing logic is configured to pass the first die test signal to a fourth die and route an output received from the fourth die back to the first die as the second die test signal.

In some examples, the system includes a third die, wherein the first die is bonded above the third die and below the second die. The test signal routing logic receives test output data from the one or more cores as the first die test signal. The first die test signal is passed through the first die to the second die and to the test signal routing logic of the first die. The second die includes an additional instance of the test signal routing logic. The test signal routing logic of the first die provides the test output data to the third die including the external device in the turn mode.

Reference will now be made in detail to specific example embodiments for carrying out the disclosed subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an application programming interface (API)). The performance of certain operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

FIG. 1 illustrates an example circuit design having a 3D stack of IC dies 100, in accordance with some embodiments. As shown in the circuit design, the 3D stack of IC dies 100 include a plurality of dies, including a bottom die 120, one or more middle dies 122 and 124, and a top die. The 3D stack of IC dies 100 is placed on a PCB 110. Each die of the 3D stack of IC dies 100 includes a testing module 130 with various testing components and one or more cores 140. The testing module 130 can implement an interface module (e.g., the SDTI module) to selectively provide test signals to and between dies on the 3D stack of IC dies 100. The testing module 130 can operate in an elevate mode in which the test signals are routed up the stack to the next adjacent die from an individual die and in which test signals received from the next adjacent die are provided back to the previous die in the stack and/or the controller on the PCB 110. In some cases, the testing module 130 can operate in a turn mode in which test signals are locally processed by the individual die and the processed test signals are provided back to the previous die in the stack and/or the controller on the PCB 110.

In some examples, a controller on the PCB 110 can transmit test signals including a testing pattern to any individual die in the 3D stack of IC dies 100 to test any component on the individual die. For example, the controller on the PCB 110 can transmit a test pattern to the testing module 130 of the bottom die 120. The controller on the PCB 110 can transmit instructions to the bottom die 120 to operate any individual one of the one or more cores 140 implemented on the bottom die 120. The testing module 130 can selectively route the output of the one or more cores 140 after processing the test signals as test signal output data back to the controller on the PCB 110.

In some examples, the bottom die 120 can route the test pattern of the test signals in parallel or in a serial manner to each one of the dies in the 3D stack of IC dies 100. For example, the bottom die 120 can provide the test pattern to the one or more middle dies 122 and/or the one or more middle dies 124. For example, the controller on the PCB 110 can program a particular die of the one or more middle dies 122 to be tested. In such cases, the particular die of the one or more middle dies 122 can store a value that programs the testing module 130 of the particular die to operate in turn mode (which can be the default mode of operation). All other dies in the 3D stack of IC dies 100 are operated by the elevate mode (by programming such a mode into their respective routing logic or, if placed by default in that mode, by keeping the dies operating according to default operations). In some cases, all of the dies in the 3D stack of IC dies 100 are operated by default in the turn mode or by default in the elevate mode. In such cases, the die 120 can be in the elevate mode and the dies 124 can be by default configured in the turn mode.

In such cases, the particular die (e.g., a first die) receives the test pattern as a test input signal. The first die processes the test pattern to generate a test output signal. The test output signal is provided to the testing module 130 of the first die, which also receives an output signal from the next adjacent die (e.g., a second die) in the 3D stack of IC dies 100. Because the testing module 130 of the first die is programmed to operate in turn mode, the testing module 130 of the first die returns the test output signal to the previous die (e.g., a third die) in the 3D stack of IC dies 100 and particularly to the testing module 130 of the third die instead of providing the output signal received from the second die. As referred to herein, the term "next" die in the stack refers to a die in the 3D stack of IC dies that is bonded above vertically or horizontally to an individual die and the term "previous" die in the stack refers to a die in the 3D stack of IC dies that is bonded below vertically or horizontally to the individual die, where the individual die is sandwiched between the previous and next dies.

The testing module 130 of the third die in the 3D stack of IC dies 100 has been programmed to operate in the elevate mode of operation. In such cases, rather than routing a locally generated signal by the third die in the 3D stack of IC dies 100, the third die in the 3D stack of IC dies 100 selects the signal received from the first die in the 3D stack of IC dies 100 to return to the previous die that is bonded below the third die or directly to the controller on the PCB 110 if the third die is the first die in the 3D stack of IC dies 100. In this way, each die in the 3D stack of IC dies 100 can use and implement the same exact SDTI module, which further reduces the design and implementation complexities encountered by conventional approaches. In this way, each individual die in the 3D stack of IC dies 100 can selectively be tested by an external component implemented on a PCB 110 or a bottom die 120 which improves the overall functioning of the device and reduces complexities and time. This also reduces the overall cost in designing and testing a 3D stack of IC dies 100.

Figure 2:
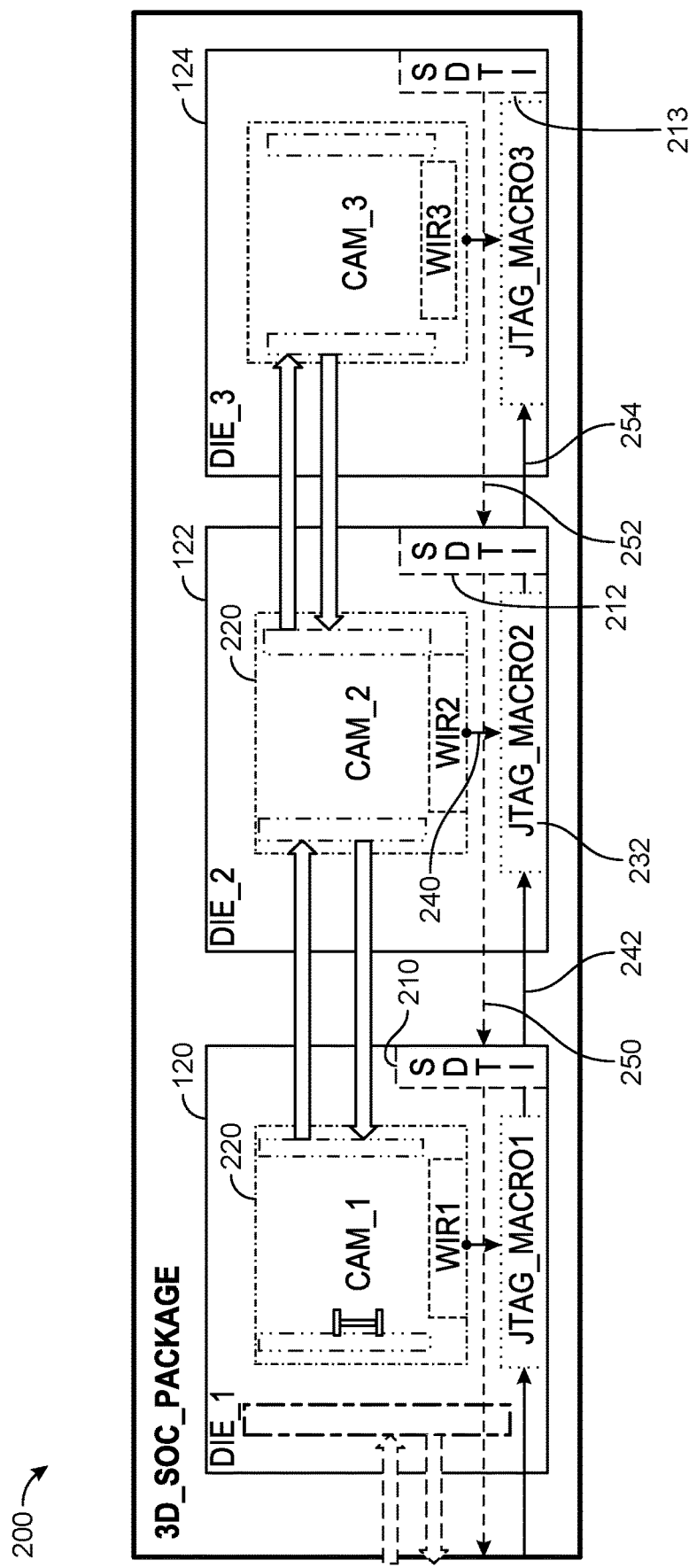
FIGS. 2 and 3 are diagrams illustrating example interface modules between the 3D stack of IC dies, in accordance with some embodiments.

FIG. 2 is a diagram 200 illustrating an example interface module between the 3D stack of IC dies, in accordance with some embodiments. The diagram 200 represents the 3D stack of IC dies 100 shown in FIG. 1. Particularly, as shown in diagram 200, the 3D stack of IC dies 100 includes the bottom die 120, one or more middle dies 122, and one or more middle dies 124. Each of the dies shown in the 3D stack of IC dies 100 includes respective cores 220.

The bottom die 120 includes a first SDTI module 210 that implements test signal routing logic, such as using one or more multiplexors and one or more storage elements or registers. Similarly, the one or more middle dies 122 each include a respective second SDTI module 212 that implements additional instances of test signal routing logic. The one or more middle dies 122 and all other dies in the 3D stack of IC dies 100 include respective JTAG modules 232 that control the testing operations of the respective individual dies. A top die 124 can include an SDTI module 213 that implements the additional instances of test signal routing logic.

In some examples, the controller on the PCB 110 can transmit a test pattern 242 to input data interface elements of the bottom die 120. The bottom die 120 routes the test pattern 242 to each of the other dies in the stack of dies via output data interface elements in a pass through arrangement. In some cases, each die locally stores a respective test pattern, which can avoid the need to receive the test pattern passed through each of the dies through their interconnects.

In some examples, the controller on the PCB 110 can program the first die of the one or more middle dies 122 to be tested. To do so, the respective second SDTI module 212 of the first die can store a value that places the respective second SDTI module 212 in a turn mode of operation. The SDTI modules of all other dies in the 3D stack of IC dies 100 are operated by default in the elevate mode of operation. In some cases, the SDTI modules of all other dies in the 3D stack of IC dies 100 are operated by default in the turn mode of operation. In such cases, the SDTI modules are programmed to operate in the elevate mode when the second SDTI module 212 is programmed to operate in the turn mode. Specifically, the SDTI module 210 can be placed in the elevate mode and the SDTI module for die 124 can be programmed in the turn mode. In this way, only one of the dies in the 3D stack of IC dies 100 operates in the turn mode of operation while the rest of the dies operate in the elevate mode to allow the one of the dies to be tested and to provide test results back to the calling controller on the PCB 110. For example, the die 120 can be programmed to operate in the elevate mode and die 122 can be programmed to operate in the turn mode to prevent serial data from transferring to die 124 due to the turn in die 122. The die 120 receives test result data from die 122 and routes such data to the external component.

The first die processes the test pattern 242 (e.g., received from the output data interface of the bottom die 120) to generate a test output signal 240. In some cases, the first die passes the test pattern 242 and/or other test control signals 254 to the second die of the one or more middle dies 124. The second die is programmed to operate in an elevate mode and so the SDTI module of the second die returns back to the second SDTI module 212 signals the second die receives from the next adjacent die that is bonded above the second die.

The test output signal 240 is provided to the second SDTI module 212 (e.g., via the JTAG module 232) of the first die of the one or more middle dies 122. The second SDTI module 212 also receives an output signal 252 from the second die of the one or more middle dies 124 in the 3D stack of IC dies 100, which can be the top-most die. The second SDTI module 212 of the first die is programmed to operate in turn mode. In response, the second SDTI module 212 of the first die returns a test output signal 250 (e.g., generated by the respective cores 220 of the first die) to the bottom die 120 in the 3D stack of IC dies 100 and particularly to the first SDTI module 210 of the bottom die 120 instead of providing the output signal received from the second die.

The testing module 130 of the bottom die 120 in the 3D stack of IC dies 100 has been programmed to operate in the elevate mode of operation. In response, rather than routing a signal that has been locally generated by the cores 220 of the bottom die 120 in the 3D stack of IC dies 100, the bottom die 120 selects the signal received from the first die of the one or more middle dies 122 to return to the controller on the PCB 110.

In some examples, the controller on the PCB 110 can program the second die of the one or more middle dies 124 to be tested. To do so, the respective SDTI module 213 of the second die can store a value that places the respective second SDTI module 213 in a turn mode of operation. The SDTI modules of all other dies in the 3D stack of IC dies 100 including the first die of the one or more dies 122 are operated by in the elevate mode of operation. By placing the SDTI module 212 of the die 122, the test signals can reach die 124 and results from die 124 are routed back to the bottom die for transmission to the external component via the die 122 and other dies between the bottom die and the die 124. Namely, the SDTI module 210 and the SDTI module 212 are placed in the elevate mode of operation and the SDTI module 213 is placed in the turn mode to route signals in this manner.

The first die receives the test pattern 242 from the bottom die 120 and the second SDTI module 212 of the first die elevates the test pattern 242 to the second die of the one or more middle dies 124. The second die of the one or more middle dies 124 receives the test pattern as the other test control signals 254 and processes the test pattern to generate the output signal 252. The SDTI module of the second die is programmed to operate in the turn mode by storing a configuration bit that sets the routing pattern of multiplexors. In this case, rather than passing the other test control signals 254 received from the first die to the next die, the second die passes signals that were locally generated (e.g., results of performing tests using the test pattern) by one or more cores of the second die to the next die. The second die also returns back as the output signal 252 the signals that were locally generated to the first die of the one or more dies 122. Now, the second SDTI module 212 of the first die returns the test output signal 252 (e.g., generated by the respective cores of the second die) to the bottom die 120 in the 3D stack of IC dies 100 and particularly to the first SDTI module 210 of the bottom die 120 instead of providing signals locally generated by the one or more cores 220 of the first die. The bottom die 120 provides the test results performed by the second die to a controller on the PCB 110.

Figure 3:
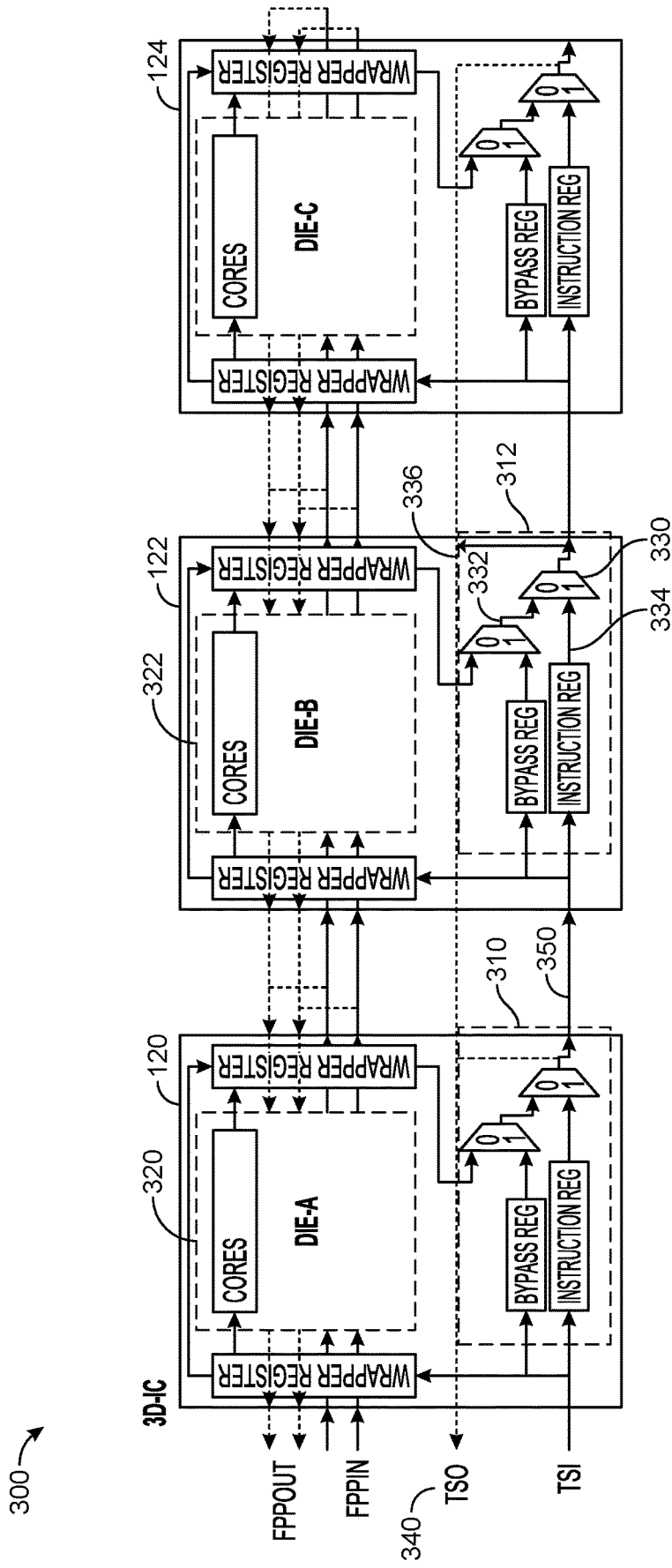

FIG. 3 is a diagram 300 illustrating an example interface module between the 3D stack of IC dies, in accordance with some embodiments. The diagram 300 is similar to the diagram 200 and performs similar operations. The 3D stack of IC dies shown in diagram 300 includes a more detailed view of the SDTI module of each die in the 3D stack of IC dies. Particularly, the bottom die 120 includes one or more cores 320 and a first SDTI module 310. The first SDTI module 310 corresponds to and performs similar functions as the first SDTI module 210 shown in FIG. 2. The second die of the one or more middle dies 122 includes one or more cores 322 and a second SDTI module 312. The second SDTI module 312 corresponds to and performs similar functions as the second SDTI module 212 shown in FIG. 2.

As shown, each of the first SDTI module 310 and the second SDTI module 312 includes a set of registers that are programmed to operate the respective SDTI module in elevate or turn mode and one or more multiplexors for routing signals according to the operating mode. For example, with reference to the second SDTI module 312, the set of registers can be programmed to operate in the turn mode of operation. In this case, a test signal 350 received from the first SDTI module 310 is received by the instruction registers and output as a test signal 334. The test signal 334 is routed to a first input of a first multiplexor 330. The first multiplexor 330 receives, at a second input, an output 332 of the one or more cores 322 (e.g., via a second multiplexor). The output 332 can represent results of performing one or more tests corresponding to the test pattern by the one or more cores 322.

In the turn mode of operation, the select input of the first multiplexor 330 is set to select the output 332 received from the one or more cores 322 instead of the test signal 334. An output 336 of the first multiplexor 330 is coupled to the second die of the one or more middle dies 124 and also back to the bottom die 120. In such cases, the first SDTI module 310 of the bottom die 120 receives the output 336 and provides the output 336 as an output signal 340 (e.g., TSO) to a controller on the PCB 110.

As another example, with reference to the second SDTI module 312, the set of registers can be programmed to operate in the elevate mode of operation by default. In this case, a test signal 350 received from the first SDTI module 310 is received by the instruction registers and output as a test signal 334. The test signal 334 is routed to a first input of a first multiplexor 330. The first multiplexor 330 receives, at a second input, an output 332 of the one or more cores 322 (e.g., via a second multiplexor). The output 332 can represent results of performing one or more tests corresponding to the test pattern by the one or more cores 322.

In the elevate mode of operation, the select input of the first multiplexor 330 is set to select the test signal 334 instead of the output 332 corresponding to the signal received from the one or more cores 322. The output 336 of the first multiplexor 330 is coupled to the second die of the one or more middle dies 124 and also back to the bottom die 120. In such cases, the SDTI module of the second die of the one or more middle dies 124 receives the test signal 334 from the first die of the one or more middle dies 122. The SDTI module of the second die of the one or more middle dies 124 can be configured to operate in the turn mode. In such cases, the SDTI module of the second die of the one or more middle dies 124 can receive test result signals from one or more cores of the second die and return such signals as the output 336 to the bottom die 120 via the first die of the one or more middle dies 122.

Figure 4:
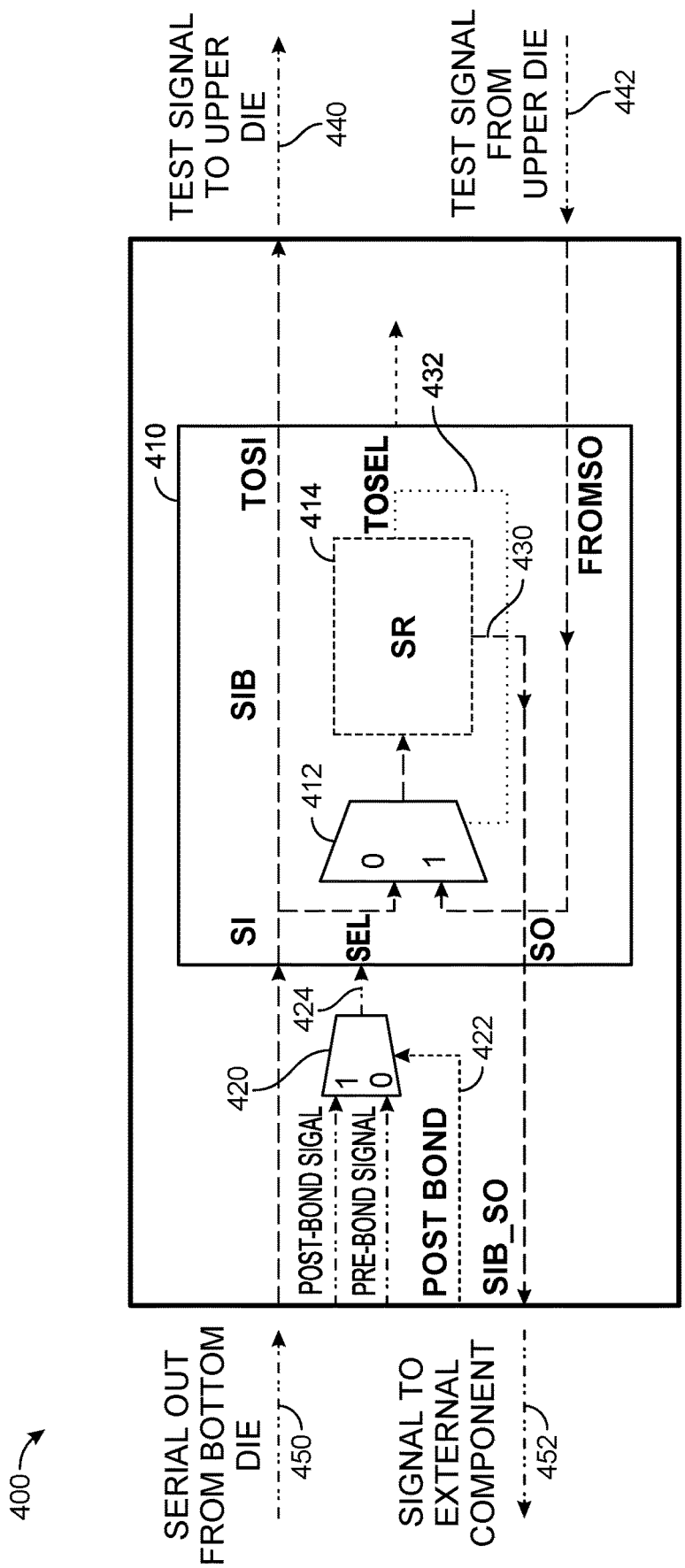
FIG. 4 is a diagram of an example interface module for a 3D die stack, in accordance with some embodiments.

FIG. 4 is a diagram of an example interface module 400 for a 3D die stack, in accordance with some embodiments. The interface module 400 shown in FIG. 4 is an example implementation of one or each of the SDTI modules discussed in connection with FIGS. 1-3 above. Particularly, the interface module 400 represents a subset of components included in the first SDTI module 210 and/or the second SDTI module 212. The interface module 400 includes a segment insertion bit (SIB) structure 410 with a first multiplexor 412 and a shift register (SR) 414. The interface module 400 also includes a second multiplexor 420. The first multiplexor 412 can correspond to the first multiplexor 330 and the second multiplexor 420 can correspond to the second multiplexor shown in FIG. 3.

The SR 414 can be programmed to control the mode of operation of the interface module 400. Particularly, to program the interface module 400 to operate in the turn mode, the SR 414 stores a logic value of '0'. This causes the SR 414 to output a select signal 432 to control the first multiplexor 412 to output the value of the first input of the first multiplexor 412. The first input of the first multiplexor 412 can be coupled to a signal 450. The signal 450 can be generated by a JTAG of the die on which the interface module 400 is implemented. In some examples, the signal 450 can correspond to a test signal or test pattern received from a previous die when the die on which the interface module 400 operates is in the elevate mode. In some examples, the signal 450 can correspond to a test output signal representing results from performing one or more tests using one or more cores of the die on which the interface module 400 operates in the turn mode.

The SIB structure 410 outputs the signal 450 to the next die as a signal 440. The SIB structure 410 also receives a test signal 442 from the next die. The test signal 442 is provided to a second input of the first multiplexor 412. When the SR 414 is programmed to operate in the turn mode, the first multiplexor 412 selects the first input corresponding to the signal 450 rather than the test signal 442 received at the second input. The output of the first multiplexor 412 is routed through the SR 414 and is output as a signal 430. The signal 430 is returned to a previous die via an output interface 452.

In some cases, the SIB structure 410 is configured to operate in the elevate mode. In such cases, the SR 414 stores a logic value of '1' that is output as the select signal 432 to the select input of the first multiplexor 412. In such cases, the SIB structure 410 is configured to return to the previous die via the output interface 452 a signal received from the next die and specifically the test signal 442 received from the next die. Particularly, the first multiplexor 412 now selects the test signal 442 to output to the SR 414, which then generates the signal 430 for output to the output interface 452. In this way, the SR 414 controls whether the die on which the interface module 400 is implemented routes signals locally generated representing test results back to the previous die (e.g., the bottom die 120) or routes signals generated by a next die (e.g., the second die of the one or more middle dies 124) back to the previous die.

In some examples, the second multiplexor 420 receives a post-bond control signal at a first input and a pre-bond control signal at a second input. The second multiplexor 420 outputs a signal 424 that selectively activates one or more components of the SIB structure 410. Particularly, when a post-bond control signal 422 is asserted, the post-bond signal is output by the second multiplexor 420 as the signal 424. In this case, the SIB structure 410 is activated to selectively control whether test signals are elevated or turned by the die on which the interface module 400 is implemented. In these circumstances, control signals are received by the interface module 400 from a previous die or are locally generated by one or more cores of the die on which the interface module 400 is implemented. Any of the control signals generated by the JTAG of the die on which the interface module 400 is implemented are bypassed.

When a post-bond control signal 422 is de-asserted, the pre-bond signal is output by the second multiplexor 420 as the signal 424. In this case, the SIB structure 410 is deactivated. In such cases, the SEL signal of the SIB structure 410 is received from a test signal associated with performing a pre-bond test. The SIB structure 410 can be configured in the turn mode of operation to perform the pre-bond test. In some instances, this bypasses functionality performed by the SIB structure 410, such as to preserve power. In such cases, the control signals generated by the JTAG of the die on which the interface module 400 is implemented are used to perform test operations on the die and to provide such test results as output signals.

Figure 5:
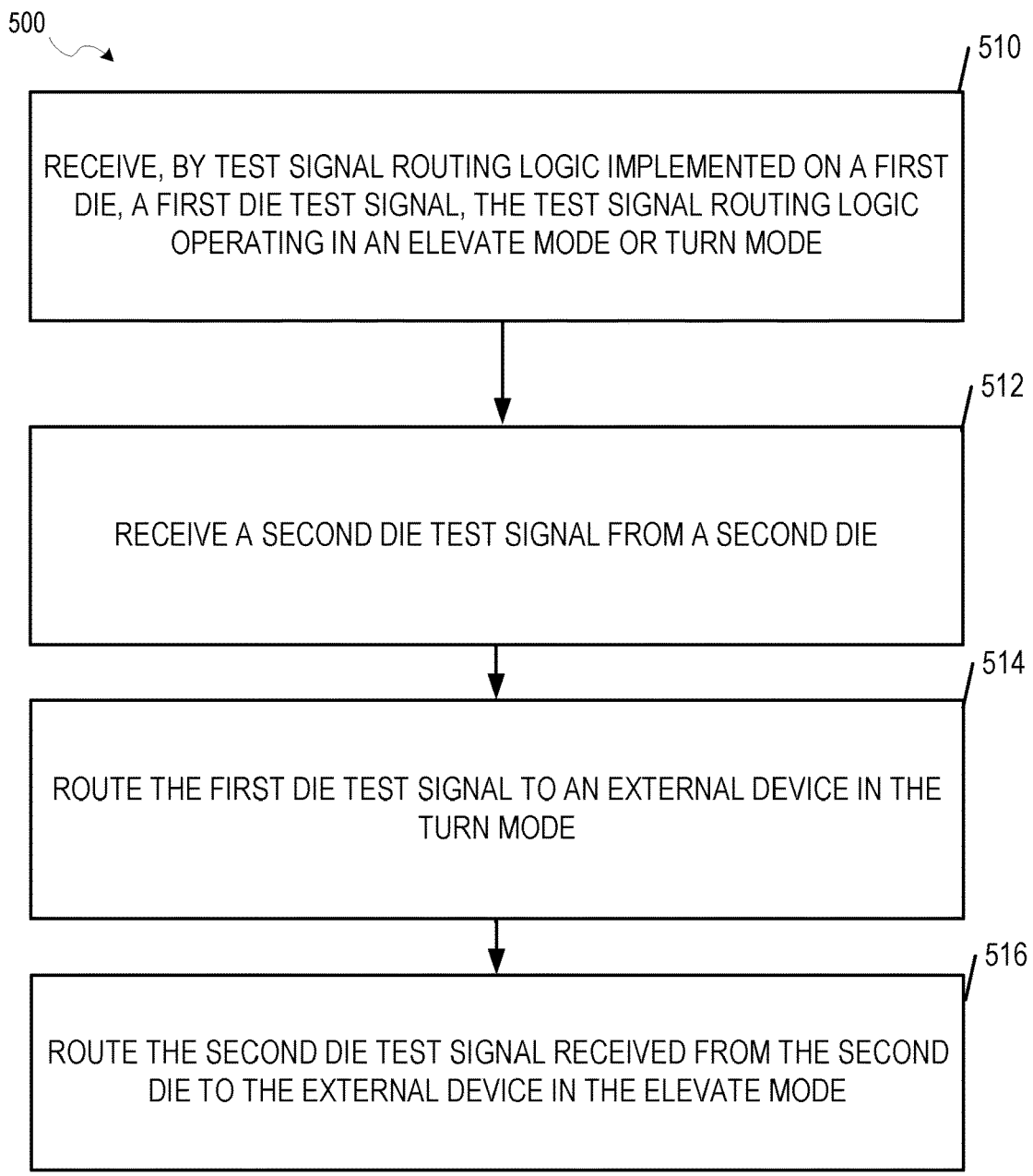
FIG. 5 illustrates an example method for performing testing of individual dies in a 3D die stack, in accordance with some embodiments.

FIG. 5 illustrates an example method 500 for performing testing individual dies in a 3D die stack, in accordance with some embodiments. The method 500 begins with operation 510 where test signal routing logic (e.g., an interface module) implemented on a first die receives a first die test signal, with the test signal routing logic operating in an elevate mode or turn mode. Then, at operation 512, a second test signal is received from a second die. At operation 514, the first die test signal is routed to an external device in response to determining that the first die is operating in the turn mode. At operation 516, the second die test signal received from the second die is routed to the external device in response to determining that the first die is operating in the elevate mode.

Figure 6:
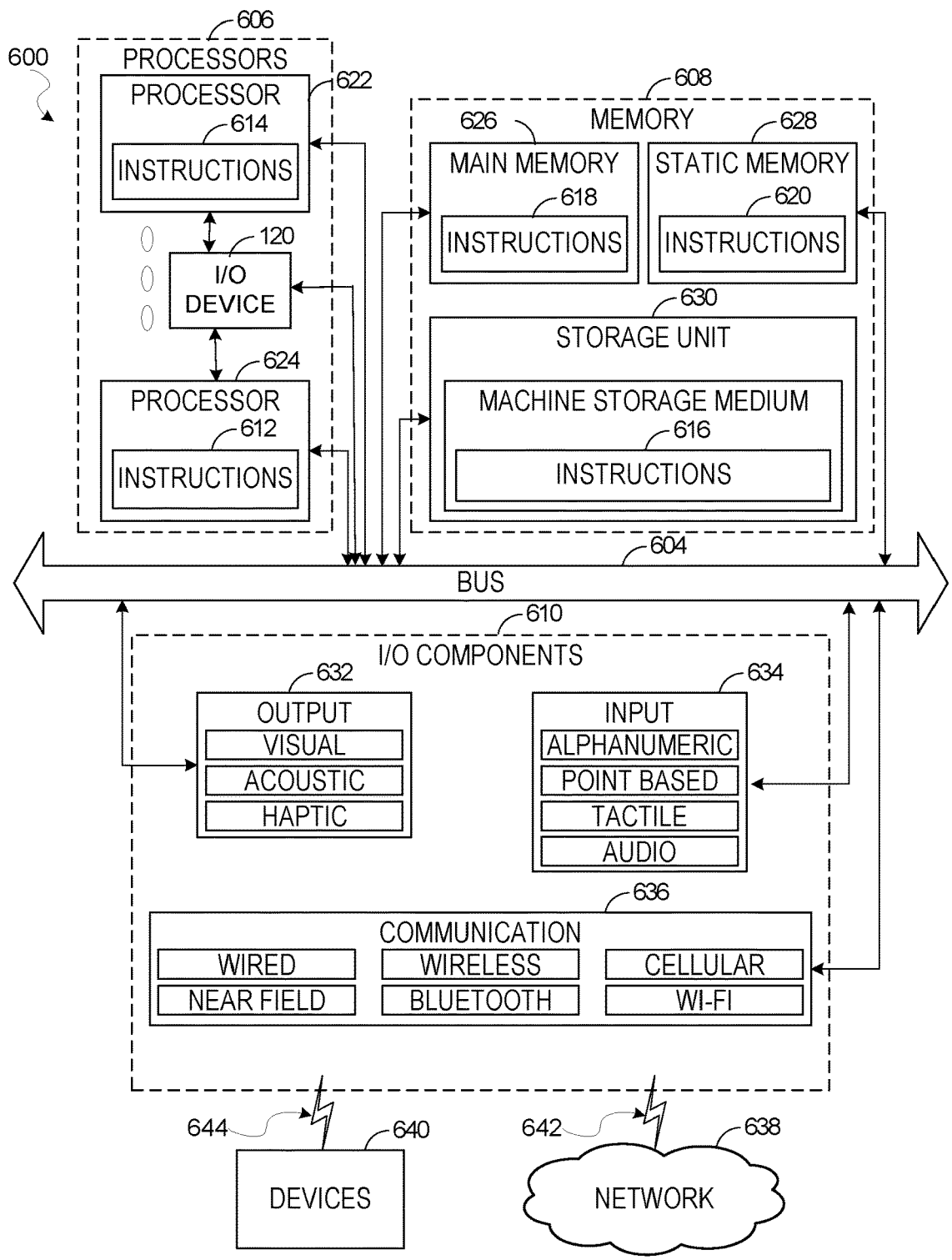
FIG. 6 is a functional block diagram of an example computing system for carrying out methods and operations described herein, in accordance with some embodiments of the present disclosure.

FIG. 6 is a functional block diagram of a computing system 600 for executing method 500 and other processes described above, along with other embodiments of the present disclosure. The computing system 600 may execute an EDA software system for performing the method 500, and other processes described above, in accordance with some embodiments of the present disclosure. A machine is shown in the form of a computer system within which a set of instructions may be executed for causing the machine to perform the method 500 and other methodologies discussed herein, according to some embodiments. Specifically, FIG. 6 shows a diagrammatic representation of the machine 602 in the example form of a computer system. The machine 602 may include a bus 604, processors 606, memory 608, and input/output (I/O) components 610, which may be configured to communicate with each other such as via the bus 604.

The machine 602 may include instructions 612-620 (e.g., software, a program, an application, an applet, an app, or other executable code) for causing the machine 602 to perform any one or more of the methodologies discussed herein. For example, the instructions 612-620 may cause the machine 602 to execute an EDA software system that executes the above processes described in the above description. The instructions 612-620 transform the general, non-programmed machine 602 into a particular machine 602 programmed to carry out the described and illustrated functions in the manner described here. In alternative embodiments, the machine 602 operates as a standalone device or may be coupled (e.g., networked) to other machines. In a networked deployment, the machine 602 may operate in the capacity of a server machine or a client machine in a server-client network environment, or as a peer machine in a peer-to-peer (or distributed) network environment. The machine 602 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 612-620, sequentially or otherwise, that specify actions to be taken by the machine 602. Further, while only a single machine 602 is illustrated, the term "machine" shall also be taken to include a collection of machines 602 that individually or jointly execute the instructions 612-620 to perform any one or more of the methodologies discussed herein.

In an example embodiment, the processors 606 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 622 and a processor 624 that may execute the instructions 614 and 612. The term "processor" is intended to include multi-core processors 606 that may comprise two or more independent processors (sometimes referred to as "cores") that may execute instructions contemporaneously. Although FIG. 6 shows multiple processors 606, the machine 602 may include a single processor with a single core, a single processor with multiple cores (e.g., a multi-core processor), multiple processors with a single core, multiple processors with multiple cores, or any combination thereof.

The memory 608 may include a main memory 626, a static memory 628, and a storage unit 630, all accessible to the processors 606 such as via the bus 604. The main memory 626, the static memory 628, and the storage unit 630 store the instructions 616-620 embodying any one or more of the processes, methodologies or functions described herein. The instructions 612-620 may also reside, completely or partially, within the main memory 626, within the static memory 628, within the storage unit 620, within at least one of the processors 606 (e.g., within the processor's cache memory), or any suitable combination thereof, during execution thereof by the machine 602.

The I/O components 610 may include a wide variety of components to receive input, provide output, produce output, transmit information, exchange information, capture measurements, and so on. The specific I/O components 610 that are included in a particular machine will depend on the type of machine. For example, portable machines such as mobile phones will likely include a touch input device or other such input mechanisms, while a headless server machine will likely not include such a touch input device. It will be appreciated that the I/O components 610 may include many other components that are not shown in FIG. 6. The I/O components 610 are grouped according to functionality merely for simplifying the following discussion and the grouping is in no way limiting. In various example embodiments, the I/O components 610 may include output components 632 and input components 634. The output components 632 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 634 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 610 may include communication components 636 operable to couple the machine 602 to a network 638 or devices 640 via a coupling 642 and a coupling 644, respectively. For example, the communication components 636 may include a network interface component or another suitable device to interface with the network 638. In further examples, the communication components 636 may include wired communication components, wireless communication components, cellular communication components, and other communication components to provide communication via other modalities. The devices 640 may be another machine or any of a wide variety of peripheral devices (e.g., a peripheral device coupled via a universal serial bus (USB)).

Executable Instructions and Machine Storage Medium

The various memories (e.g., 608, 618, 620 and/or memory of the processor(s) 606, 622, 624) and/or the storage unit 630 may store one or more sets of instructions and data structures (e.g., software) embodied or utilized by any one or more of the methodologies or functions described herein. These instructions, when executed by the processor(s) 606, cause various operations to implement the disclosed embodiments.

As used herein, the terms "machine-storage medium," "device-storage medium," and "non-transitory computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media, "computer-storage media," and "device-storage media" specifically exclude carrier waves, modulated data signals, and other such media, at least some of which are covered under the term "signal medium" discussed below.

Transmission Medium

In various example embodiments, one or more portions of the network 638 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 638 or a portion of the network 638 may include a wireless or cellular network, and the coupling 642 may be a Code Division Multiple Access (CDMA) connection, a Global System for Mobile communications (GSM) connection, or another type of cellular or wireless coupling. In this example, the coupling 642 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 612-620 may be transmitted or received over the network 638 using a transmission medium via a network interface device (e.g., a network interface component included in the communication components 636) and utilizing any one of a number of well-known transfer protocols (e.g., hypertext transfer protocol (HTTP)). Similarly, the instructions 612-620 may be transmitted or received using a transmission medium via the coupling 644 (e.g., a peer-to-peer coupling) to the devices 640. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 612-620 for execution by the machine 602, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media (non-transitory computer readable media or medium) and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, method or process that includes elements in addition to those listed after such a term in a claim is still deemed to fall within the scope of that claim.

What is claimed is:

1. A system comprising:
   a first die comprising one or more cores; and
   test signal routing logic, implemented on the first die, that operates in an elevate mode or turn mode, the test signal routing logic configured to:
      receive a first die test signal;
      receive a second die test signal from a second die;
      route the first die test signal to an external device in the turn mode; and
      route the second die test signal received from the second die to the external device via the first die in the elevate mode.

2. The system of claim 1, wherein the external device comprises a controller configured to test a plurality of dies.

3. The system of claim 1, wherein the external device comprises a third die.

4. The system of claim 3, wherein the first die is bonded between the third die and the second die to form a three-dimensional (3D) stacked integrated circuit (IC) die structure.

5. The system of claim 1, wherein the first die test signal is generated by the one or more cores of the first die as a result of processing a test pattern applied to the one or more cores.

6. The system of claim 1, wherein the first die test signal is received from a third die that is bonded to the first die.

7. The system of claim 1, wherein the test signal routing logic comprises:
   a multiplexor that receives the first die test signal and the second die test signal; and
   a shift register coupled to an output of the multiplexor, the shift register being coupled to a select input of the multiplexor to control whether the test signal routing logic operates in the elevate mode or the turn mode.

8. The system of claim 7, wherein the shift register stores a value representing whether the test signal routing logic operates in the elevate mode or the turn mode.

9. The system of claim 1, wherein the first and second die test signals comprise serial data signals.

10. The system of claim 1, further comprising post bond activation circuitry, the post bond activation circuitry configured to selectively activate the test signal routing logic.

11. The system of claim 10, wherein the post bond activation circuitry comprises a selection circuitry that is configured to:
   receive a first set of data corresponding to pre-bond operations of the first die;
   receive a second set of data corresponding to post-bond operations of the first die;
   receive a post bond select signal; and
   output the first or second set of data to an activation input of the test signal routing logic based on the post bond select signal.

12. The system of claim 11, wherein the test signal routing logic is in a deactivated state when the first set of data is received by the test signal routing logic; and
   wherein the test signal routing logic is in an active state when the second set of data is received by the test signal routing logic.

13. The system of claim 11, further comprising:
   a JTAG controller implemented on the first die for generating one or more control signals, wherein the one or more control signals are routed to be processed by the one or more cores when the post bond select signal is deactivated; and
   wherein the one or more control signals generated by the JTAG controller are bypassed to route control signals from a third die to the one or more cores when the post bond select signal is activated, the third die being bonded to the first die.

14. The system of claim 1, further comprising:
   a third die, wherein the first die is bonded above the third die and below the second die, wherein:
      the third die provides the first die test signal to the test signal routing logic of the first die; and
      the first die test signal is passed through the first die to the second die and to the test signal routing logic of the first die, wherein the second die comprises an additional instance of the test signal routing logic.

15. The system of claim 14, wherein the additional instance of the test signal routing logic is configured to operate the second die in the turn mode or elevate mode.

16. The system of claim 15, wherein when the additional instance of the test signal routing logic operates the second die in the turn mode, the additional instance of the test signal routing logic is configured to:
   receive test output data by one or more cores of the second die; and
   provide the test output data to the first die as the second die test signal, wherein the first die provides the test output data to the third die comprising the external device.

17. The system of claim 15, wherein when the additional instance of the test signal routing logic operates the second die in the elevate mode, the additional instance of the test signal routing logic is configured to:
   pass the first die test signal to a fourth die; and
   route an output received from the fourth die back to the first die as the second die test signal.

18. The system of claim 1, further comprising:
   a third die, wherein the first die is bonded above the third die and below the second die, wherein:
      the test signal routing logic receives test output data from the one or more cores as the first die test signal;
      the first die test signal is passed through the first die to the second die and to the test signal routing logic of the first die, wherein the second die comprises an additional instance of the test signal routing logic; and
      the test signal routing logic of the first die provides the test output data to the third die comprising the external device in the turn mode.

19. A method comprising:
   receiving, by test signal routing logic implemented on a first die, a first die test signal, the test signal routing logic operating in an elevate mode or turn mode;
   receiving a second die test signal from a second die;
   routing the first die test signal to an external device in the turn mode; and routing the second die test signal received from the second die to the external device via the first die in the elevate mode.

20. An apparatus comprising:

means for receiving, by test signal routing logic implemented on a first die, a first die test signal, the test signal routing logic operating in an elevate mode or turn mode;

means for receiving a second die test signal from a second die;

means for routing the first die test signal to an external device in the turn mode; and means for routing the second die test signal received from the second die to the external device via the first die in the elevate mode.

* * * * *